US006617208B2

(12) United States Patent
Saran

(10) Patent No.: US 6,617,208 B2
(45) Date of Patent: Sep. 9, 2003

(54) HIGH CAPACITANCE DAMASCENE CAPACITORS

(75) Inventor: Mukul Saran, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/932,400

(22) Filed: Aug. 17, 2001

(65) Prior Publication Data

US 2002/0022331 A1 Feb. 21, 2002

Related U.S. Application Data

(60) Provisional application No. 60/226,384, filed on Aug. 18, 2000.

(51) Int. Cl.[7] ............................................ H01L 4/8242

(52) U.S. Cl. ...................... 438/240; 438/241; 438/253; 438/396; 257/306; 257/301; 257/295

(58) Field of Search ................................ 438/253, 240, 438/241, 396, 3, 250, 393, 239; 257/306, 301, 295

(56) References Cited

U.S. PATENT DOCUMENTS

| | | | | |
|---|---|---|---|---|
| 5,135,883 | A | | 8/1992 | Bae et al. |
| 5,583,359 | A | | 12/1996 | Ng et al. |
| 6,008,085 | A | | 12/1999 | Sung et al. |
| 6,235,579 | B1 | * | 5/2001 | Lou .......................... 438/253 |
| 6,452,251 | B1 | * | 9/2002 | Bernstein et al. ........... 257/532 |
| 6,485,988 | B2 | * | 11/2002 | Ma et al. ....................... 438/3 |
| 6,492,222 | B1 | * | 12/2002 | Xing .......................... 438/240 |
| 6,534,809 | B2 | * | 3/2003 | Moise et al. ................ 257/295 |
| 6,548,343 | B1 | * | 4/2003 | Summerfelt et al. ........ 438/240 |

* cited by examiner

*Primary Examiner*—Caridad Everhart
*Assistant Examiner*—V. Yevskiov
(74) *Attorney, Agent, or Firm*—Peter K. McLarty; W. James Brady, III; Frederick J. Telecky, Jr.

(57) ABSTRACT

The invention describes a high capacitance damascene capacitor. A etch-stop/capacitor dielectric layer 60 is sandwiched between two conductive plates 40 and 75 to form an integrated circuit capacitor. One metal plate 40 is copper formed using a damascene process. The high capacitance of the structure is due to the thin high k dielectric material used to form the etch-stop/capacitor dielectric layer 60.

11 Claims, 3 Drawing Sheets

HIGH CAPACITANCE DAMASCENE CAPACITORS

This application claims priority under 35 USC §119(e) (1) of provisional application Ser. No. 60/226,384, filed Aug. 18, 2000.

FIELD OF THE INVENTION

The invention is generally related to the field of semiconductor devices and fabrication and more specifically to high capacitance damascene capacitors.

BACKGROUND OF THE INVENTION

Capacitors built into the backend interconnect structures are useful in some circuits. Currently there are a number of schemes for fabricating such capacitors using aluminum based interconnect technology. Here, silicon dioxide is used to form the isolation layers between the various aluminum metal layers in the integrated circuit. With a dielectric constant of about 3.9 silicon dioxide is a suitable capacitor dielectric. Current schemes involve using the various metal levels as the plates of the capacitor structures. Such a capacitor is shown in FIG. 1. In the Figure, silicon dioxide layers 12, 14, 16, 18, on the silicon substrate 10 represent the isolation layers between the various aluminum metal layers 22. Alternate metal layers 22 are connected using vias 24 to increase the capacitance of the structure.

The requirement of higher clock rates has lead to the use of copper to form the metal interconnect lines in integrated circuits. In addition to the use of copper, isolation layers such as florosilicate glass (FSG) (dielectric constant ≈3.6) and organosilicate glass (OSG) (dielectric constant ≈2.6) are currently being used to take advantage of the lower dielectric constant of such materials compared to silicon dioxide. To achieve the same capacitance value using a dielectric with a lower dielectric constant, capacitors with larger areas have to be formed. This increased area requirement is in direct contrast to the requirement of higher integration and reduced area devices. In integrated circuits using copper interconnect lines, there is a need for a high capacitance structure with reduced area.

SUMMARY OF THE INVENTION

The present invention describes a high capacitance damascene capacitor and a method for making the same. The capacitor comprises: a first conductive layer with a top surface; a second conductive layer with a bottom surface; and a dielectric layer adjacent to said top surface of said first metal layer and to said bottom surface of said second metal layer.

In addition to the above described capacitor structure, the first conductive layer is copper, the second conductive layer is a material selected from the group consisting of aluminum, aluminum oxide, tantalum nitride, titanium nitride, tungsten, tungsten nitride, silicon carbide, and their alloys, and the dielectric layer is silicon nitride.

A method of making the high capacitance damascene capacitor according to the instant invention comprises: providing a silicon substrate with a first dielectric film containing at least one copper layer; forming a second dielectric layer over said first dielectric layer and said copper layer; forming a first conductive layer over said first dielectric layer; and removing a region of said first conductive layer such that a portion of said second dielectric layer remains between said first conductive layer and said copper layer.

The above described method further comprises: forming copper contacts to said first conductive layer; and forming a second copper layer that electrically contacts said copper contacts. In addition to the above, the second dielectric layer is an etch-stop/barrier layer.

DETAILED DESCRIPTION OF THE INVENTION

The invention will now be described with reference to FIGS. 2A–2F and FIG. 3. It will be apparent to those of ordinary skill in the art that the benefits of the invention can be applied to other structures where high value capacitor is required.

Figure 1:
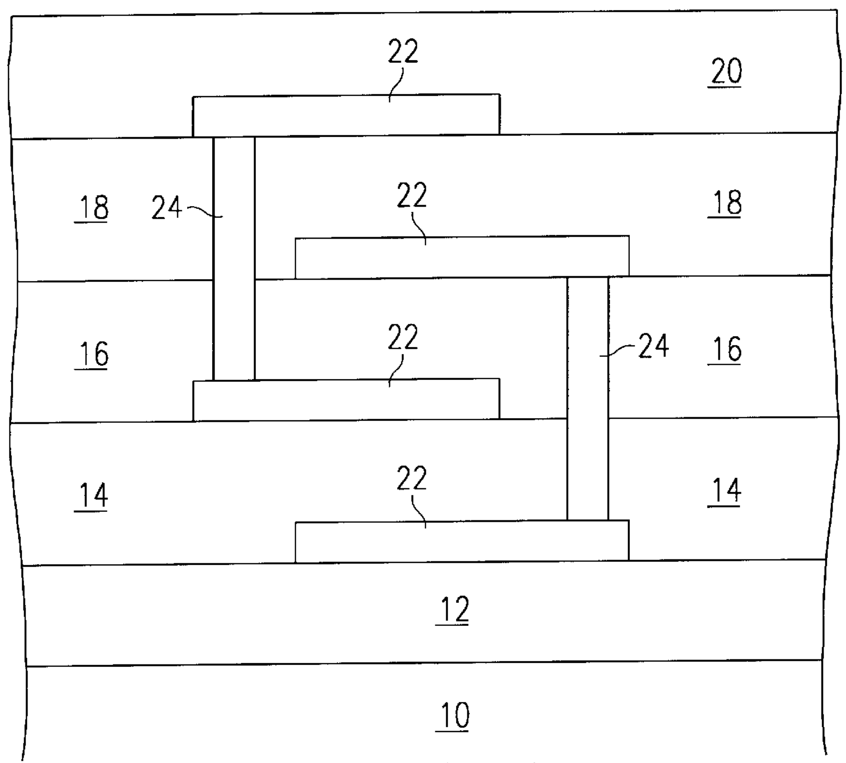
FIG. 1 is a cross-sectional diagram of a stacked aluminum capacitor.
Figure 2A:
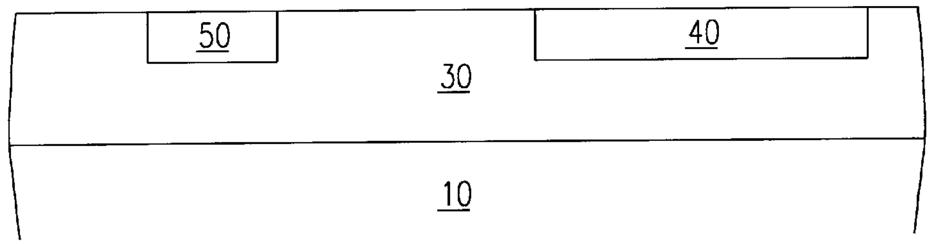
FIGS. 2A–2F are cross-sectional diagrams illustrating one embodiment of the instant invention.

A silicon substrate 100 may be single-crystal silicon or an epitaxial silicon layer formed on a single crystal substrate is shown in FIG. 1. This substrate may contain any number of integrated circuit devices such as transistors, diodes, etc., which all form part of the integrated circuit. This devices are omitted from FIGS. 2A–2F for clarity. Following the fabrication of such devices, a first intra-metal-dielectric (IMD) layer 30 is formed on the substrate and copper metal layers 40 and 50 are formed in the IMD layer 30. Typically, these copper layers 40, 50 are formed using a damascene process. In the damascene process a trench is first formed in the IMD layer 30. A trench liner/barrier film is then formed in the trench followed by copper deposition. The trench liner usually comprises a tantalum nitride film with typical field thickness on the order of 100 A–2000 A. Following copper film formation, which completely fills the trench, chemical mechanical polishing (CMP) is performed to remove the excess copper and produce the copper layers 40 and 50 whose top surfaces are planar with the surface of the IMD layer 30 as shown in FIG. 2A. The copper layer 40 will function as one plate of a capacitor structure and 50 is part of the metal interconnect structure associated with a metal level or layer in the integrated circuit.

Figure 2B:
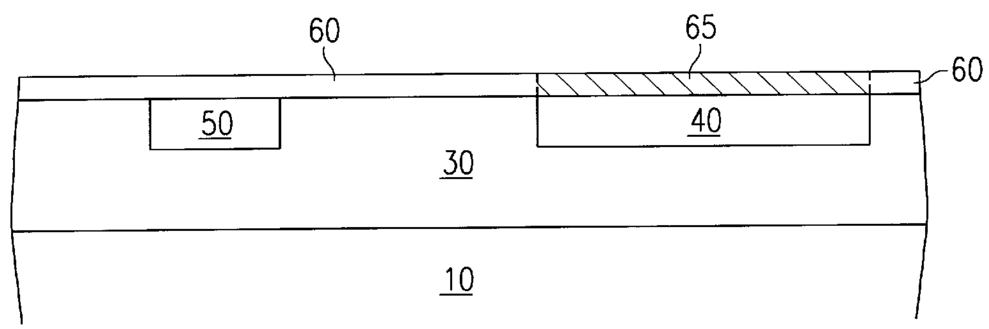
Figure 2C:
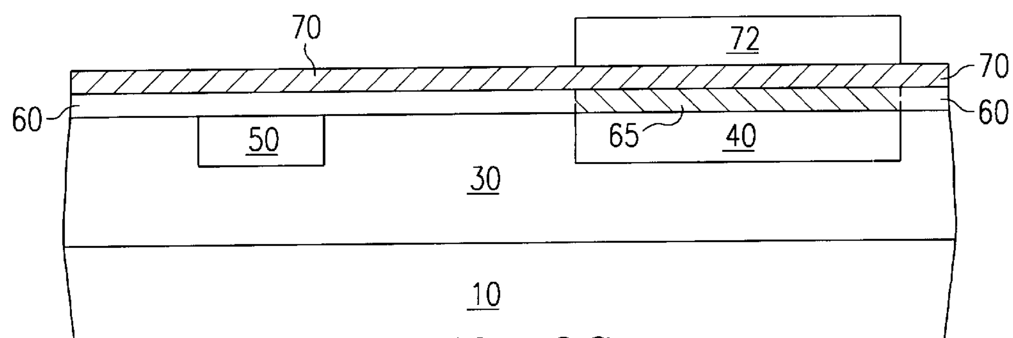

Following the formation of the copper layers 40 and 50, a dielectric film 60 is formed on the top surface of the IMD layer 30 and the copper layers 40 and 50. In an embodiment of the instant invention, this dielectric film comprises silicon nitride with typical thickness of 50 A–500 A. In typical integrated circuit copper processes this dielectric film functions as a etch-stop and barrier layer. However in regions where capacitors are to be formed, this dielectric film will function as the capacitor dielectric. Such a region 65 is shown in FIG. 2B. In addition to silicon nitride, any other dielectric film which can function as a capacitor dielectric can be used. In addition to single dielectric films, alternating layers of different dielectric films can be used to form this layer 60.

Following the formation of the dielectric layer 60, a conductive layer 70 is formed on the dielectric layer 60, as shown in FIG. 2(*c*). This conductive layer 70 can be any conductive material, including organic conductors, which is easily integrated into integrated circuit processing. In an embodiment of the instant invention this conductive layer 70 is approximately 50 A to 300 A thick and is formed using a material from the group consisting of aluminum, aluminum oxide, tantalum nitride, titanium nitride, tungsten, tungsten nitride, silicon carbide, and their alloys. The key characteristics of the material used to form the conductive layer 70 are: it is conductive (including semiconductive, which can be heated to make conductive), and it has etch selectivity against the dielectric layer which is formed above it. Some conductive polymers may not meet the above criterion.

Following the formation of the conductive layer 70, a photoresist film is formed and patterned 72 on the conductive film 70 over the region 65 where the capacitor is to be formed. This patterned photoresist film 72 will protect the underlying conductive film 70 during the subsequent etch process to remove unprotected regions of the conductive film 70. The patterning process is not restricted to photolithography and the use of photoresist. Additional techniques such as e-beam lithography could also be used to pattern the film. The conductive film 70 is selectively etched and the patterning film 72 is removed.

Figure 2D:
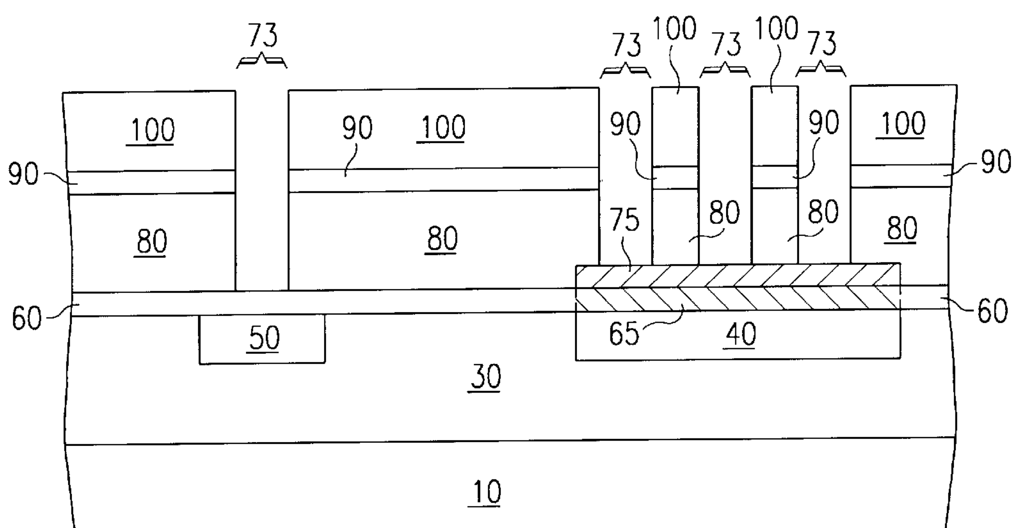

As shown in FIG. 2D, the portion of the conductive film 75 which remains after the etch process will function as a plate of the capacitor. For the capacitor structure shown in FIG. 2D, the copper layer 40 and the patterned conductive film 75 both function as plates of the capacitor and that portion of the dielectric layer 65 which lies between 40 and 75 functions as the capacitor dielectric. The large capacitance values of the capacitor formed from 75, 65, and 40 is due to the thin dielectric layer 60 which has a high dielectric constant compared to that of commonly used dielectric materials such as silicon dioxide, FSG, and organosilicate glass (OSG). Following the formation of the patterned conductive film 75, an inter layer dielectric (ILD) 80 is formed on the structure. In an embodiment of the instant invention this ILD layer 80 comprises a conventional silicon oxide layer, a FSG layer or a OSG layer that is about 2000 A–7000 A thick. A planarization step may be necessary after the ILD deposition. An etch-stop layer 90 is then formed on the ILD layer. In an embodiment, this etch stop layer 90 comprises a 50 A–600 A thick silicon nitride film. A 3000 A–5000 A thick IMD layer 100 is then formed on the etch-stop layer 90 which can be comprised of silicon oxide, FSG, OSG or any material with similar properties. It should be noted that in other embodiments of the instant invention the etch-stop layer 90 can be omitted without changing the scope of the invention. In the case where this etch-stop layer 90 is omitted, the ILD and IMD material may be identical and homogeneous. Following the formation of the ILD/etch-stop/IMD stack 80/90/100, openings for vias 73 are formed using standard photolithographic patterning followed by etching processes. The etching processes will comprise an IMD etch for 100 followed by an etch-stop etch for 90 followed by an ILD etch for 80. A criteria of the ILD etch process is that it be selective with respect to the etch-stop/barrier material 60 and also to the patterned conductive film 75.

Figure 2E:
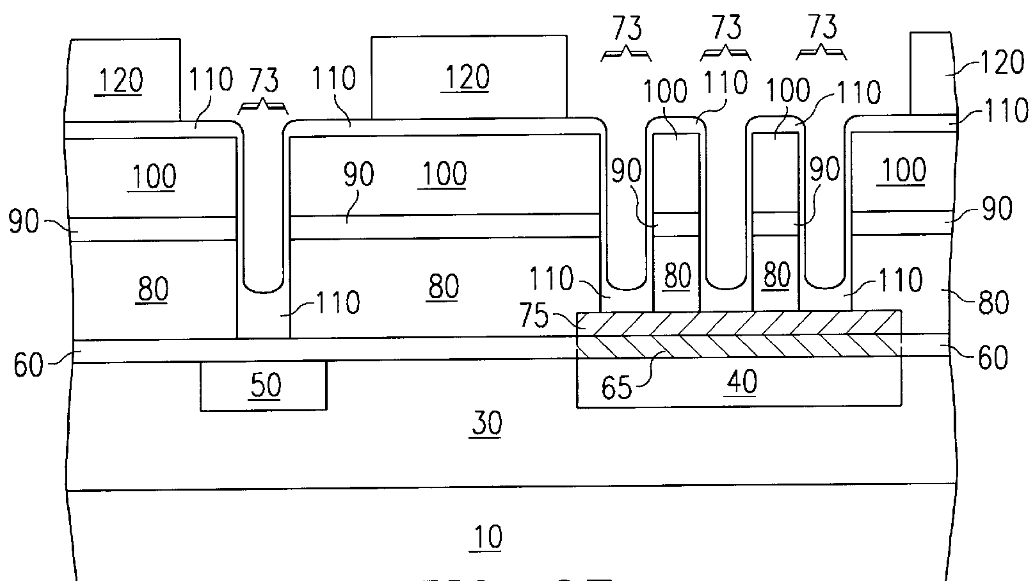
Figure 2F:
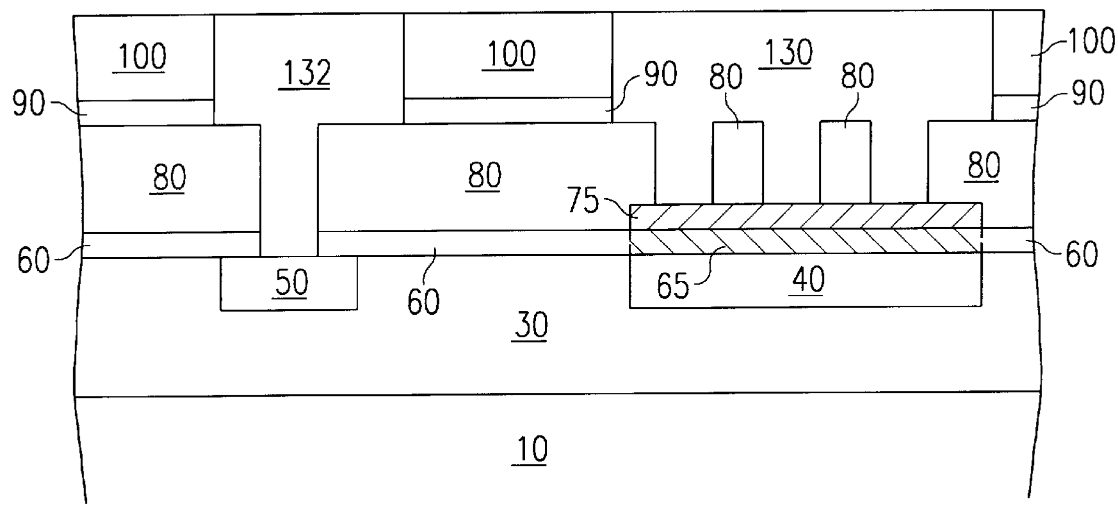

Following the formation of the via openings 73, a protective film 110 is formed on the structure as shown in FIG. 2E. In an embodiment of the instant invention, this protective film comprises an anti-reflective coating or a BARC film. This film 110 partially fills the via openings 73 and will protect the material at the bottom of the via openings 73 during the subsequent trench etch process. A photoresist film is then formed and patterned 120 on this protective coating 110 to define the regions of the IMD layer 90 that will be removed during the trench etch process. In forming the trenches in the IMD layer 100, the layer is first etched with an etch process that is selective with respect to the etch barrier 90. This selective etch process removes those portions of the IMD layer 100 not protected by the patterned photoresist film 120. In addition, this etch process also removes the BARC film 100 from the via openings 73. Following this IMD etch, a blanket etch process is performed that removes any etch-stop material remaining at the bottom of the via openings 73. Because the patterned conductive film 75 will be exposed to this etch process it is important that this etch process be selective to the material of the patterned conductive film 75. Following the removal of the remaining photoresist 120, a trench liner film is formed on the structure followed by the deposition of a copper layer that completely fills the vias and the trenches on the structure. The trench liner usually comprises a tantalum nitride film with typical thickness on the order of 50 A–300 A. CMP processes are used to remove any excess copper resulting in the structure shown in FIG. 2F. The copper structure 130 provides electrical contact to the patterned conductive film (i.e. capacitor plate) 75 and the copper structure 132 functions as part of the metal interconnect of the integrated circuit.

The capacitor structure is formed by the copper layer 40, the dielectric (etch-stop) layer 65, and the conductive film 75. Layer 60 serves the dual purpose of acting as the capacitor dielectric 65 and a etch-stop/barrier layer for other areas of the integrated circuit. The formation of the conductive film 75 is added to the integrated circuit processing sequence to form a plate of the capacitor. Following the formation of the capacitor structure, any number of different schemes can be used to contact the plates of the capacitor. The embodiment described above represents one such scheme. In addition, any number of such capacitors can be connected in parallel to increase the value of capacitance. Various shapes can be used to form the capacitor plates 40 and 75 to increase the capacitance including an interdigitated scheme. Such a scheme comprises a series of interlocking fingers formed by the capacitor plates.

Figure 3:
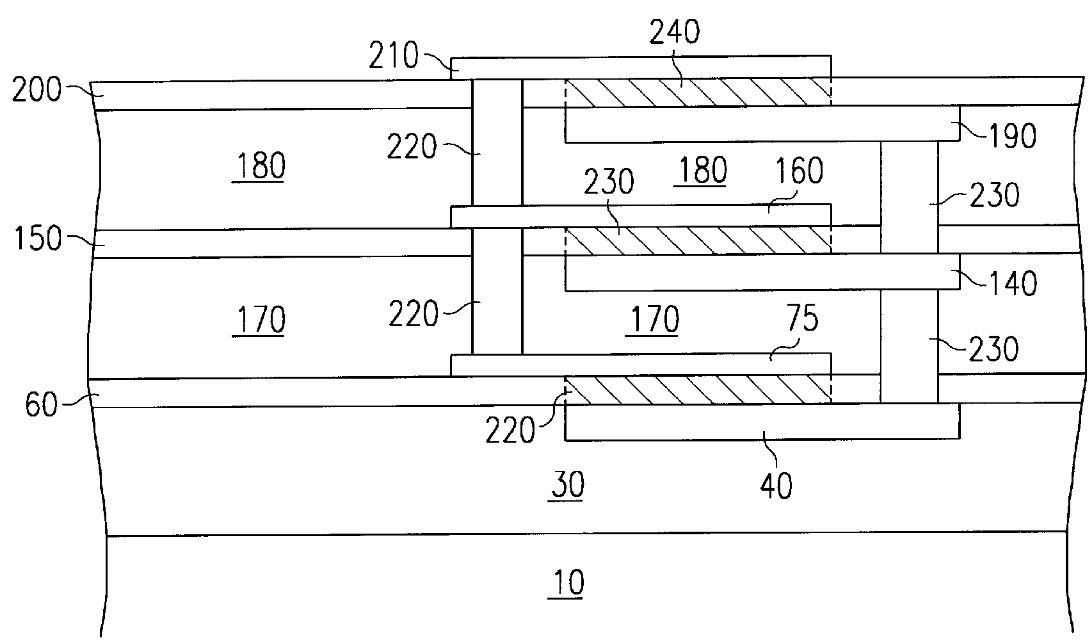
FIG. 3 is a cross-section diagram illustrating a stacked capacitor scheme according to an embodiment of the instant invention.

Shown in FIG. 3 is a stacked capacitor structure according to an embodiment of the instant invention. Region 220 of the etch-stop/barrier dielectric layer 60 forms the dielectric region between the copper layer 40 and the conductive layer 75 which form the plates of a capacitor. A second dielectric layer is formed above the conductive layer 75 and a second copper layer 140 is formed in this dielectric layer. A second dielectric etch-stop/barrier layer 150 is formed and a second conductive layer 160 is formed above this dielectric etch-stop/barrier layer. Region 230 of the second etch-stop/barrier layer 150 functions as the capacitor dielectric. A third dielectric layer 180 is formed above the second conductive layer 160 and a third copper layer 190 is formed in this dielectric layer 180. A third dielectric etch-stop/barrier layer 200 is formed and a third conductive layer 210 is formed on this dielectric etch-stop/barrier layer 200. All the conductive layers 75, 160, and 210 can be formed using a material from the group comprising aluminum, aluminum oxide, tantalum nitride, titanium nitride, tungsten, tungsten nitride, silicon carbide, and their alloys. To form the stacked capacitor structure a first set of vias 220 are used to electrically connect all the existing conductive layers 210, 160, and 75 and a second set of vias 230 are used to electrically connect all the copper layers 40, 140, and 190. This stacked capacitor structure can be extended to any number of copper layer and conductive layer capacitors. The above described method of interconnecting the various capacitors is one embodiment of the instant invention. Any parallel connection of the various capacitors can be used to produce a stacked capacitor structure according to the instant invention.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. An integrated circuit capacitor comprising:

a first metal layer with a top surface;

a dielectric etch-stop/barrier layer on said first metal layer;

a conductive layer on said dielectric etch-stop/barrier layer;

a second dielectric layer above said dielectric etch-stop/barrier layer and said conductive layer; and a second metal layer above said second dielectric layer.

2. The integrated circuit capacitor of claim 1 wherein said first and second metal layers are copper.

3. The integrated circuit capacitor of claim 2 wherein said conductive layer is a material selected from the group consisting of aluminum, aluminum oxide, tantalum nitride, titanium nitride, tungsten, tungsten nitride, silicon carbide, and their alloys.

4. The integrated circuit capacitor of claim 3 wherein said dielectric etch-stop/barrier layer is silicon nitride.

5. An integrated circuit capacitor comprising:

a copper layer with a top surface;

a conductive layer with bottom surface; and an etch-stop/barrier dielectric layer wherein a portion of said etch-stop/barrier dielectric layer is adjacent to said top surface of said copper layer and to said bottom surface of said conductive layer.

6. The integrated circuit capacitor of claim 5 wherein said conductive layer is a material selected from the group consisting of aluminum, aluminum oxide, tantalum nitride, titanium nitride, tungsten, tungsten nitride, silicon carbide, and their alloys.

7. The integrated circuit capacitor of claim 6 wherein said etch-stop/barrier dielectric layer is silicon nitride.

8. The integrated circuit capacitor of claim 6 wherein said etch-stop/barrier dielectric layer comprises a plurality of dielectric films with varying dielectric constants.

9. A stacked integrated circuit capacitor comprising:

a plurality of copper layers;

a plurality of conductive layers;

a plurality of dielectric etch-stop/barrier layers positioned between each pair of said plurality of copper layers and said plurality of conductive layers; and interconnecting said plurality of copper layers and said plurality of conductive layers to form a stacked capacitor structure.

10. The stacked integrated circuit capacitor of claim 9 wherein said plurality of conductive layers are materials selected from the group consisting of aluminum, aluminum oxide, tantalum nitride, titanium nitride, tungsten, tungsten nitride, silicon carbide, and their alloys.

11. The stacked integrated circuit capacitor of claim 9 wherein said plurality of dielectric etch-stop/barrier layers is silicon nitride.

* * * * *